(12) United States Patent
Tamura et al.

(10) Patent No.: US 6,413,698 B1
(45) Date of Patent: Jul. 2, 2002

(54) PHOTOHARDENABLE RESIN COMPOSITION PROVIDING HEAT-RESISTANT PHOTOHARDENED PRODUCT

(75) Inventors: Yorikazu Tamura; Tsuneo Hagiwara; Makoto Ohtake, all of Kanagawa; Minoru Shinoda, Aichi; Toshiharu Suzuki, Aichi; Tatsuhiko Ozaki, Aichi; Yasushi Ishihama, Wakayama; Takayuki Nakamura, Wakayama, all of (JP)

(73) Assignees: Teijin Seiki Co., Ltd., Tokyo; Takemoto Yushi Kabushiki Kaisha, Aichi; Shin-Nakamura Chemical Co., Ltd., Wakayama, all of (JP)

(*) Notice: Subject to any disclaimer, the term of this patent is extended or adjusted under 35 U.S.C. 154(b) by 0 days.

(21) Appl. No.: 09/478,462

(22) Filed: Jan. 6, 2000

(30) Foreign Application Priority Data

Jan. 8, 1999 (JP) .............................. 11-003499

(51) Int. Cl.$^7$ .............................. G03F 7/028
(52) U.S. Cl. .............................. 430/284.1; 430/285.1; 522/96; 522/97; 522/92; 560/183; 560/209; 560/221; 560/222; 560/115
(58) Field of Search .............................. 560/183, 209, 560/221, 222, 115; 430/285.1, 284.1; 522/77, 96, 97, 92

(56) References Cited

U.S. PATENT DOCUMENTS

3,782,961 A * 1/1974 Takahashi et al. ........ 430/284.1
3,891,523 A * 6/1975 Hisamatsu et al. .... 204/159.15
3,907,865 A * 9/1975 Miyata et al. .......... 260/471 C

FOREIGN PATENT DOCUMENTS

EP 0 802 455 A1 * 10/1997

\* cited by examiner

*Primary Examiner*—Cynthia Hamilton
(74) *Attorney, Agent, or Firm*—Akin, Gump, Strauss, Hauer & Feld, L.L.P.

(57) ABSTRACT

A photohardenable resin composition comprising (A) a urethanated acrylic compound represented by formula (I):

$$(A)_a-C-(R)_{4-a}$$

wherein R is H or alkyl; a is 3 or 4; and A represents a group of formula (II):

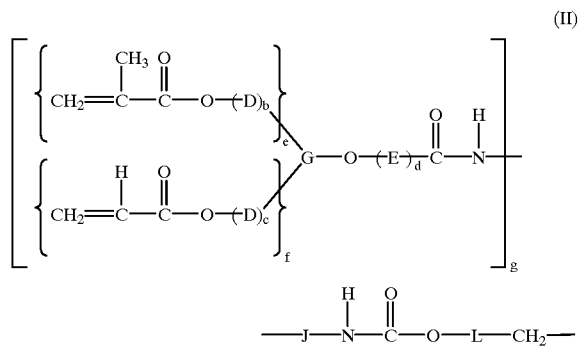

wherein D represents —$CH_2CH_2O$—, —$CH_2CH(CH_3)O$—, —$CH_2CH_2COO$— or —$(CH_2)_6COO$—; E represents —$CH_2CH_2O$—, —$CH_2CH(CH_3)O$—, —$COCH_2CH_2O$— or —$CO(CH_2)_6O$—; G represents a diol or triol residual group; J represents a divalent or trivalent and substituted or unsubstituted hydrocarbon group; L represents —$(CH_2CH_2O)_h$— (h: integer of 1 to 4), —$(CH_2CH(CH_3)O)_j$— (j: integer of 1 to 4), or —$(CH_2CH_2O)_k$—$(CH_2CH(CH_3)O)_m$— (k, m: integer of 1 to 3 (k+m=2, 3 or 4); b, c, and d are each 0 or 1 (b+c+d=1, 2 or 3); e is 0, 1 or 2; f is 0 or 1 (e+f=1 or 2); and g is 1 or 2, and (B) a radical polymerizable compound at a (A) : (B) ratio of 80:20 to 10:90 by weight.

12 Claims, No Drawings

PHOTOHARDENABLE RESIN COMPOSITION PROVIDING HEAT-RESISTANT PHOTOHARDENED PRODUCT

FIELD OF THE INVENTION

This invention relates to a novel urethanated acrylic compound, a photohardenable resin composition containing the compound, a process for producing the composition, and a process for producing a three-dimensional object using the composition. More particularly, it relates to a photohardenable resin composition which hardens on irradiation with minimized volume shrinkage to provide a molded part or a three-dimensional object having high dimensional accuracy, a high heat distortion temperature (i.e., high heat resistance), high transparency, and excellent mechanical characteristics, such as tensile strength; a process for producing the photohardenable resin composition; a process for producing a three-dimensional object by stereolithography using the photohardenable resin composition; and a urethanated acrylic compound used in the photohardenable resin composition.

BACKGROUND OF THE INVENTION

Liquid photohardenable resin compositions are generally in wide use as a coating material, especially a hard coating material, a photoresist, a dental material, and the like. In recent years attention has been paid to stereolithography for building up a three-dimensional object from a photohardenable resin composition based on the data put in three-dimensional CAD. In this regard, JP-A-56-144478 discloses a process comprising applying a requisite amount of controlled light energy to a liquid photohardenable resin to harden the irradiated resin in a thin layer, supplying the liquid photohardenable resin on the hardened layer, followed by irradiation under control to harden the resin in a thin layer to be integrally superposed on the previously formed layer, and repeating these steps until a desired solid object is built up. Fundamental materialization of this technique is suggested in JP-A-60-247515. Thereafter, a large number of proposals have been made on the stereolithographic techniques, as disclosed, e.g., in JP-A-62-35966, JP-A-1-204915, JP-A-2-113925, JP-A-2-145616, JP-A-2-153722, JP-A-3-15520, JP-A-3-21432, and JP-A-3-41126.

A typical and commonly used process for producing a three-dimensional object by stereolithography comprises selectively applying a computer-controlled ultraviolet (UV) laser beam to the liquid surface of a liquid photohardenable resin composition in a container according to a designed pattern to harden the resin to a prescribed depth (thickness), supplying the liquid resin composition on the hardened layer to the thickness corresponding to one layer, applying a UV laser beam thereto to successively form a hardened layer on the preceding layer, and repeating these steps until an entire three-dimensional object is built up. This process has recently been attracting attention because three-dimensional objects having complicated shapes can be obtained easily in a relatively short time.

Photohardenable resin compositions which are widely employed as a coating material, a photoresist or a dental material generally comprise a photohardenable compound, such as an unsaturated polyester, epoxy (meth)acrylate, urethane (meth)acrylate or a (meth)acrylic ester monomer, and a photosensitive polymerization initiator.

Photohardenable resin compositions used in stereolithography generally comprise at least one photopolymerizable compound, such as a modified (poly)urethane (meth)acrylate compound, an oligoester acrylate compound, an epoxyacrylate compound, an epoxy compound, a polyimide compound, an aminoalkyd compound, and a vinyl ether compound, as a main component, and a photosensitive polymerization initiator. More recently, various improvements have been added as disclosed, e.g., in JP-A-1-204915, JP-A-1-213304, JP-A-2-28261, JP-A-2-75617, JP-A-2-145616, JP-A-3-104626, JP-A-3-114732, and JP-A-3-1147324.

From the standpoint of handling properties, formation speed and formation accuracy, a photohardenable resin composition to be used in stereolithography is required to be low-viscosity liquid, to show a low level of volume shrinkage on hardening, and to provide a three-dimensional object with satisfied mechanical characteristics. With the increasing demand for, and broadening application of, stereolithography, three-dimensional objects for some uses as intended have now been required to exhibit excellent heat resistance having a high heat distortion temperature and transparency in addition to the above-described properties. For example, three-dimensional objects for use in designing complicated heating medium circuits or analyzing the behavior of a heating medium having a complicated structure are particularly required to have low shrinkage on photohardening, a high heat distortion temperature, and excellent transparency.

In order to obtain three-dimensional objects with improved heat resistance, it has been studied to incorporate a benzene ring into the molecule of a photohardenable resin or to increase the crosslinking density of the photohardened product. However, the heat resistance achieved by these techniques of related arts is insufficient, and the possible highest heat distortion temperature is no higher than about 70 to 80° C. under a high load applied. Moreover, the so far proposed improvement on heat resistance of a photohardened product has been accompanied with increased shrinkage on photohardening, resulting in reduced dimensional accuracy. For example, an increase in crosslinking density in a photohardenable resin composition is generally expected to bring about improved heat resistance. However, an increased crosslinking density tends to lead to increased shrinkage on hardening. That is, an improvement on heat resistance and a reduction in hardening shrinkage are inconsistent with each other, and none of the above-mentioned photohardenable resin compositions of the related arts has succeeded in resolving this inconsistency. It has therefore been demanded to develop a photohardenable resin composition which simultaneously satisfies both requirements of improved heat resistance and reduced volume shrinkage on photohardening.

The present inventors have previously found that the inconsistency experienced between an improvement in heat resistance and a reduction in volume shrinkage can be eliminated by compounding a specific filler into a specific photohardenable resin composition (JP-A-9-227640). In the course of further investigations based on this finding, they have recognized that it is urgent necessity for the practice in the art to develop a photohardenable resin composition which would provide a hardened product exhibiting not only improved heat resistance and reduced volume shrinkage but improved mechanical properties in strength, elongation and toughness.

SUMMARY OF THE INVENTION

An object of the present invention is to provide a photohardenable resin composition which is low-viscosity liquid easy to handle and hardens in a short time on irradiation with minimized volume shrinkage to provide, with excellent dimensional accuracy, a molded part, a three-dimensional object or any other hardened product that has a high heat distortion temperature, i e., high heat resistance, high transparency, and excellent mechanical characteristics, such as tensile strength, elongation, and toughness.

Another object of the invention is to provide a process for producing the photohardenable resin composition.

Still another object of the invention is to provide a process for producing a three-dimensional object by stereolithography using the photohardenable resin composition.

Yet another object of the invention is to provide a novel urethanated acrylic compound which provides the photohardenable resin composition.

As a result of extensive studies, the present inventors have found that a novel urethanated acrylic compound having a specific chemical structure is extremely effective at accomplishment of the above objects. They have ascertained that the urethanated acrylic compound combined with a radical polymerizable compound and a polymerization initiator provides a liquid photohardenable resin composition which has a low viscosity and has excellent handling properties; that the photohardenable resin composition hardens in a short time on irradiation with reduced volume shrinkage to provide a three-dimensional object of desired shape and size at high dimensional accuracy; and that the resulting photohardened product exhibits high heat resistance, having a high heat distortion temperature exceeding 100° C., excellent transparency, extremely high tensile strength and elongation, and extremely high toughness.

The inventors have also found that the above-mentioned photohardenable resin composition, when additionally combined with at least one filler selected from solid particles and whiskers, enjoys further reduced volume shrinkage on photohardening and provides a hardened product having improved rigidity, improved heat resistance and dimensional accuracy while retaining the satisfied mechanical strength.

It has been confirmed that the photohardenable resin composition of the present invention is effectively applicable not only to stereolithography but also production of various molded parts and others involving photohardening.

The inventors have further discovered that the photohardenable resin composition can be prepared very easily by performing the reaction in the initial stage of preparation in the presence of a radical polymerizable compound unreactive with an isocyanate group as a diluent and that the reaction product as obtained can be used for the preparation of the photohardenable resin composition without removing the diluent.

The present invention provides a photohardenable resin composition comprising:

(A) at least one urethanated acrylic compound represented by formula (I):

wherein R represents a hydrogen atom or an alkyl group; a represents 3 or 4; and A represents a group represented by formula (II):

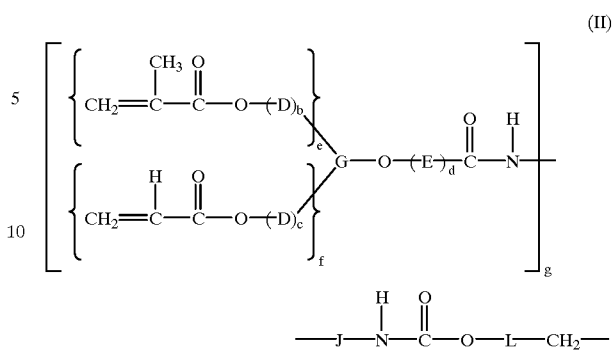

wherein D represents $-CH_2CH_2O-$, $-CH_2CH(CH_3)O-$, $-CH_2CH_2COO-$ or $-(CH_2)_6COO-$; E represents $-CH_2CH_2O-$, $-CH_2CH(CH_3)O-$, $-COCH_2CH_2O-$ or $-CO(CH_2)_6O-$; G represents a diol or triol residual group; J represents a divalent or trivalent and substituted or unsubstituted hydrocarbon group; L represents $-(CH_2CH_2O)_h-$, wherein h represents an integer of 1 to 4, $-(CH_2CH(CH_3)O)_j-$, wherein j represents an integer of I to 4, or $-(CH_2CH_2O)_k-(CH_2CH(CH_3)O)_m-$, wherein k and m each represent an integer of 1 to 3 provided that the sum of k and m is 2, 3 or 4; b, c, and d each represent 0 or 1, provided that the sum of b, c, and d is 1, 2 or 3; e represents 0, 1 or 2; f represents 0 or 1, provided that the sum of e and f is 1 or 2; and g represents 1 or 2;

(B) a radical polymerizable compound other than the urethanated acrylic compound of formula (I), (C) a photosensitive polymerization initiator; and, if desired, (D) at least one filler selected from solid particles and whiskers;

wherein the weight ratio of component (A) to component (B) is in the range of from 80:20 to 10:90.

The invention also provides a process for producing a three-dimensional object by stereolithography characterized by using the photohardenable resin composition of the invention.

The invention further provides a process for producing a photohardenable resin composition comprising the steps of:

(1) allowing a (meth)acrylic ester represented by formula (III):

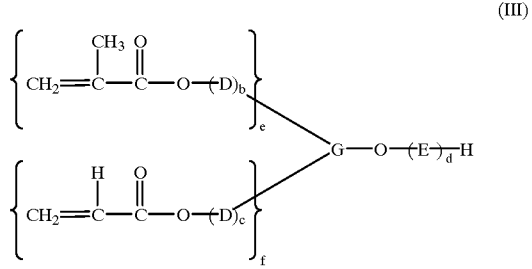

wherein D, E, G, b, c, d, e, and f are as defined above, and a polyisocyanate compound represented by formula (IV):

wherein J is as defined above; and g represents 1 or 2, to react with each other at such a ratio that one of the isocyanate groups of the polyisocyanate compound may remain unreacted per molecule, in the presence or absence of a diluent comprising a radical polymerizable compound which is different from a monoisocyanate compound represented by formula (V) below and unreactive to an isocyanate group, to obtain a reaction product comprising a monoisocyanate compound represented by formula (V):

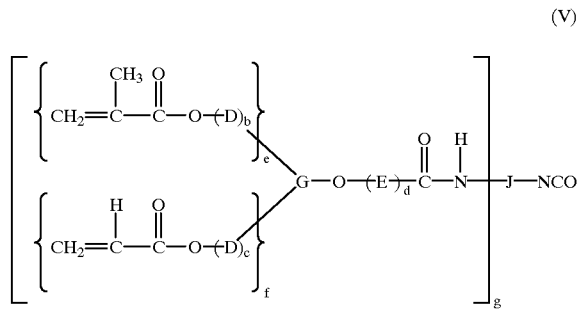

(V)

wherein D, E, G, j, b, c, d, e, f, and g are as defined above, or a reaction product comprising the monoisocyanate compound of formula (V) and the radical polymerizable compound used as a diluent, (2) allowing the reaction product obtained in step (1) to react with a polyol compound represented by formula (VI):

(VI)

wherein R, L, and a are as defined above, at such a ratio that the residual isocyanate group in the monoisocyanate compound of formula (V) and the hydroxyl group in the polyol compound of formula (VI) may react at a ratio 1:1 to obtain a reaction product comprising a urethanated acrylic compound of formula (I) or a reaction product comprising the urethanated acrylic compound of formula (I) and the radical polymerizable compound, and (3) mixing the reaction product obtained in step (2) which contains no or a small amount of the radical polymerizable compound with at least one radical polymerizable compound which may be the same as or different from the one used in step (1) to make the weight ratio of the urethanated acrylic compound of formula (I) to the total radical polymerizable compound(s) 80:20 to 10:90, and adding a photosensitive polymerization initiator to the reaction product.

The invention furthermore provides the urethanated acrylic compound of formula (I).

Since the photohardenable resin composition of the invention is low-viscosity liquid easy to handle and hardens on irradiation in a short time, it is effectively used for the manufacture of various molded parts, three-dimensional objects, and the like by photohardening processes. The composition has low volume shrinkage on photohardening so that the resulting photohardened products, such as molded parts and three-dimensional objects, have high dimensional accuracy. Further, the photohardened products obtained from the composition exhibit high heat resistance, having a high heat distortion temperature exceeding 100° C., as well as excellent mechanical characteristics, such as tensile strength and tensile elongation.

The photohardenable resin composition of the invention which contains at least one filler selected from solid particles and whiskers exhibits further reduced photohardening shrinkage and provides hardened products with further improved heat resistance and dimensional accuracy.

DETAILED DESCRIPTION OF THE INVENTION

The urethanated acrylic compound of formula (I), which can be used as component (A) of the photohardenable resin composition of the invention, is a novel compound.

In formula (I), R is a hydrogen atom or an alkyl group. The alkyl group as R preferably contains 1 to 3 carbon atoms from the standpoint of heat resistance. a is 3 or 4. That is, the compound (I) has a bulky structure carrying 3 or 4 A's per molecule.

In formula (II) representing the group A, D is —$CH_2CHO$— (ethylene oxide group), —$CH_2CH(CH_3)O$— (propylene oxide group), —$CH_2CH_2COO$— (hydroxypropionic acid residual group) or —$(CH_2)6COO$— (caprolactone residual group), and E is —$CH_2CH_2O$— (ethylene oxide group), —$CH_2CH(CH_3)O$— (propylene oxide group), —$COCH_2CH_2O$— (hydroxypropionic acid residual group) or —$CO(CH_2)_6O$— (caprolactone residual group).

b, c, and d each represent 0 or 1 provided that the sum of them is 1, 2 or 3, which means that the group A in formula (I) contains at least 1 and up to 3 D's and/or E's. The compound (I), when formulated into a photohardenable resin composition, provides a photohardened product with improvements in tensile strength, elongation, and toughness as compared with analogous compounds having no D or E.

Where b+c+d is 2 or 3, the group A has two D's, or one D plus one E, or two D's plus one E. In these cases, these groups may be the same or different.

In the group A, e is 0, 1 or 2, and f is 0 or 1, with the proviso that the sum of e and f (e+f) is 1 or 2. This means that one group A contains one to four reactive (meth) acryloyl groups, presenting 3 to 16 (meth)acryloyl groups per molecule of the compound (I). Preferred among such compounds (I) are those in which (e+f) is 2, g is 1 or 2, especially 1, and a is 3 or 4, especially 4, from the viewpoint of heat resistance and high rigidity of the resulting hardened product.

Urethanated acrylic compounds in which e is 0, and f is 2 are excluded from the scope of the invention because they cannot be synthesized without involving preparation of a glycerol diacrylate as an intermediate that is practically useless due to its toxicity, carcinogenicity, and skin irritation.

It has been generally accepted that a polymerizable compound having incorporated therein an ethylene oxide group, a propylene oxide group, a hydroxypropionic acid residual group or a caprolactone residual group is to produce a polymer having reduced heat resistance. Therefore, it is an utterly unexpected result that the urethanated acrylic compound (I) having the prescribed number of ethylene oxide, propylene oxide, hydroxypropionic acid residue and/or caprolactone residue groups as groups D or E at prescribed positions in the group A is capable of providing a photohardened product having improved strength and elongation while retaining the heat resistance. While not clear, such effects are considered attributable to the competition between the polymerization activating action of the ethylene oxide, propylene oxide, hydroxypropionic acid residue and/or caprolactone residue on the (meth)acryloyl group and the rigidity of the molecular structure of the photohardened product.

On the other hand, where any one of b, c, and d in the group A is 2 or greater, which is out of the scope of the urethanated acrylic compound (I) according to the invention, the photohardened product obtained from such a compound suffers from noticeable reduction in heat resistance.

G in the group A is a diol or triol residual group, i.e., the remainder left after removing the hydroxyl groups from a diol or a triol. The group G includes a residue of an aliphatic diol having 2 to 5 carbon atoms, an alicyclic diol, an aromatic diol, an aliphatic triol, an alicyclic triol, and an aromatic triol. Preferred of them are residual groups of such diols as ethylene glycol, propylene glycol, butylene glycol, ethoxylated bisphenol A, and spiroglycol; and of such triols as glycerol, trimethylolpropane, 5-methyl-1,2,4-heptanetriol, and 1,2,6-hexanetriol. Still preferred are an ethylene glycol residue and a glycerol residue. A glycerol residue is the most preferred.

J in the group A is a divalent or trivalent and substituted or unsubstituted hydrocarbon group. J is preferably a divalent or trivalent, substituted or unsubstituted, and aliphatic, aromatic or alicyclic hydrocarbon group having 6 to 20 carbon atoms.

The urethanated acrylic compound (I) is preferably prepared from a (meth)acrylic ester represented by formula (III) and a polyisocyanate compound represented by formula (IV) as hereinafter described in detail. Accordingly, J is preferably a divalent or trivalent residue left after removing the isocyanate groups from the polyisocyanate compound (IV) (i.e., a diisocyanate compound or a triisocyanate compound) used for the preparation of the urethanated acrylic compound (I). Specific examples of preferred groups as J include isophorone, tolylene, 4,4'-diphenylmethane, naphthylene, xylylene, phenylene, 3,3'-dichloro-4,4'-phenylmethane, toluylene, hexamethylene, 4,4'-dicyclohexylmethane, hydrogenated xylylene, hydrogenated diphenylmethane, triphenylenemethane, and tetramethylxylylene groups. Preferred among them are isophorone and/or tolylene groups. Where J is isophorone and/or tolylene groups, it is easier to adjust the balance between the shrinkage of the composition on hardening and the heat resistance of the hardened product.

Where J is a divalent hydrocarbon group, g is 1. Where J is trivalent, g is 2. In other words, when a diisocyanate compound (J—(NCO)$_2$) is used as a polyisocyanate compound (IV), there is obtained the urethanated acrylic compound (I) in which g=1. In using a triisocyanate compound (J—(NCO)$_3$), the urethanated acrylic compound (I) in which g=2 is obtained.

L represents (i) a (poly) ethylene oxide group —(CH$_2$CH$_2$O)$_h$—, wherein h represents an integer of 1 to 4, (ii) a (poly)propylene oxide group —(CH$_2$CH(CH$_3$)O)$_j$—, wherein j represents an integer of 1 to 4, or (iii) (poly) ethylene oxide—(poly)propylene oxide group —(CH$_2$CH$_2$O)$_k$—(CH$_2$CH(CH$_3$)O)$_m$—, wherein k and m each represent an integer of 1 to 3 provided that (k+m) is 2, 3 or 4. h or j is each preferably 1, 2 or 3, still preferably 1 or 2. (k+m) is preferably 2 or 3, still preferably 2.

It is particularly preferred that L be a (poly)propylene oxide group —(CH$_2$CH(CH$_3$)O)$_j$, wherein j is 1 to 4, preferably 1 to 3, still preferably 1 or 2. The photohardenable resin composition comprising the urethanated acrylic compound (I) having such L provides a photohardened product that has relatively low viscosity easy to handle, shows further minimized volume shrinkage on hardening, and forms a photohardened product having a higher heat distortion temperature and higher heat resistance.

If a urethanated acrylic compound in which h or j is greater than 4 is used as component (A), the resulting photohardened product will not have a sufficiently increased heat distortion temperature, failing to reach a desired level of heat resistance, whatever other radical polymerizable compound may be combined as component (B). If h and/or j is 0, although improvement in heat resistance can result, the resin composition undergoes appreciable shrinkage on photohardening and fails to secure satisfied dimensional accuracy. In addition, synthesis of such a urethanated acrylic compound tends to be accompanied by gelation so that the resulting compound may have extraordinarily high viscosity to be used.

Examples of the urethanated acrylic compound (I) which can be used in the photohardenable resin composition of the invention are shown below for only illustrative purposes but not for limitation.

(1) Compounds having four (meth)acryloyl groups per molecule, being represented by formula (VII):

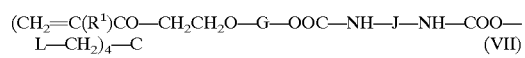
(CH$_2$=C(R$^1$)CO—CH$_2$CH$_2$O—G—OOC—NH—J—NH—COO—L—CH$_2$)$_4$—C    (VII)

wherein G, J, and L are as defined above; and R$^1$ represents a hydrogen atom or a methyl group.

(2) Compounds having three (meth)acryloyl groups per molecule, being represented by formula (VIII):

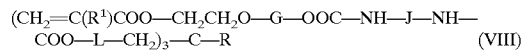
(CH$_2$=C(R$^1$)COO—CH$_2$CH$_2$O—G—OOC—NH—J—NH—COO—L—CH$_2$)$_3$—C—R    (VIII)

wherein G, J, L, and R are as defined above; and R$^1$ represents a hydrogen atom or a methyl group.

(3) Compounds having eight (meth)acryloyl groups per molecule, being represented by formula (IX):

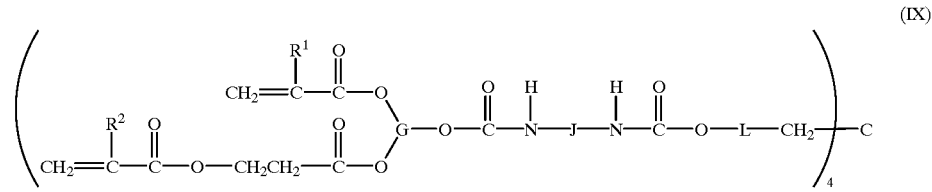

wherein G, J, and L are as defined above; $R^1$ and $R^2$ each represent a hydrogen atom or a methyl group provided that they do not each represent a hydrogen atom simultaneously.

(4) Compounds having eight (meth)acryloyl groups per molecule, being represented by formula (X):

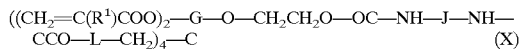

$$((CH_2=C(R^1)COO)_2-G-O-CH_2CH_2O-OC-NH-J-NH-CCO-L-CH_2)_4-C \quad (X)$$

wherein G, J, and L are as defined above; and $R^1$ represents a hydrogen atom or a methyl group provided that two $R^1$'s do not each represent a hydrogen atom simultaneously.

(5) Compounds having sixteen (meth)acryloyl groups per molecule, being represented by formula (XI):

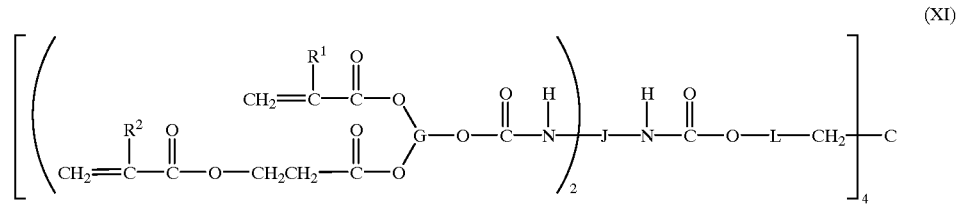

(XI)

wherein G, J, and L are as defined above; and $R^1$ and $R^2$ each represent a hydrogen atom or a methyl group provided that they do not each represent a hydrogen atom simultaneously.

(6) Compounds having twelve (meth)acryloyl groups per molecule, being represented by formula (XII):

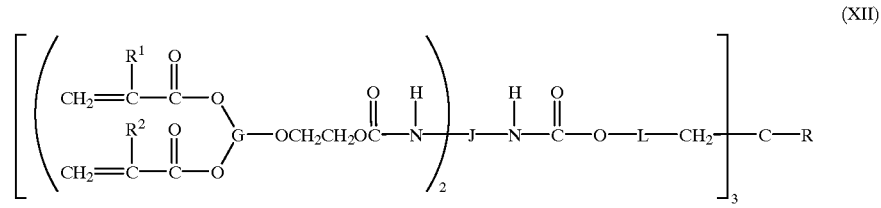

(XII)

wherein G, J, and L are as defined above; and $R^1$ and $R^2$ each represent a hydrogen atom or a methyl group provided that they do not each represent a hydrogen atom simultaneously.

The photohardenable resin composition of the invention comprises (A) the urethanated acrylic compound (I) and (B) a radical polymerizable compound other than the urethanated acrylic compound (I) (hereinafter simply referred to as a radical polymerizable compound). Any radical polymerizable compound having a carbon-carbon unsaturated bond that is capable of reacting with the urethanated acrylic compound (I) and/or among its molecules upon being irradiated to form a hardened product can be used as component (B). Acrylic compounds, allyl compounds and/or vinyl lactams are preferred.

The radical polymerizable compound may be a monofunctional compound, a polyfunctional compound, or a mixture thereof. It may be a low-molecular monomer or oligomer. One having a relatively high molecular weight can be used in some cases.

Specific but non-limiting examples of the radical polymerizable compound useful in the photohardenable resin composition include monofunctional ones, such as (meth) acrylates, e.g., isobornyl (meth)acrylate, bornyl (meth) acrylate, dicyclopentenyl (meth)acrylate, 2-hydroxyethyl (meth)acrylate, 2-hydroxypropyl (meth)acrylate, (poly) propylene glycol mono (meth)acrylate, and t-butyl (meth) acrylate, (meth)acrylamides, e.g., morpholine (meth) acrylamide, and N-vinylcaprolactone; and polyfunctional ones, such as trimethylolpropane tri (meth)acrylate, ethylene oxide-modified trimethylolpropane tri(meth)acrylate, ethylene glycol di (meth)acrylate, diethylene glycol (meth) acrylate, triethylene glycol (meth)acrylate, tetraethylene glycol di(methyacrylate, polyethylene glycol (meth) acrylate, 1,4-butanediol di(meth)acrylate, 1,6-hexanediol di (meth)acrylate, neopentyl glycol di(meth)acrylate, dicyclopentenyl di(meth)acrylate, diallyl phthalate, diallyl fumarate, and ethylene oxide-modified bisphenol A diacrylate.

In addition to the above-enumerated radical polymerizable compounds, those conventionally used in resin compositions for stereolithography are also useful as component (B), such as epoxy compounds, other urethanated acrylic compounds, epoxy (meth)acrylate compounds, and other (meth)acrylic esters.

These radical polymerizable compounds can be used either individually or as a mixture of two or more thereof. Preferred among the above-described radical polymerizable compounds are morpholine (meth)acrylamide, dicyclopentenyl di(meth)acrylate, and N-vinylcaprolactam, which will provide a photohardenable resin composition that has reduced volume shrinkage on photohardening to produce a molded part, a three-dimensional object or any other hardened products excellent in dimensional accuracy, heat resistance (having a high heat distortion temperature), transparency, and rigidity.

It is required that the ratio of component (A) to component (B) be 80:20 to 10:90 by weight. A preferred (A) to (B) weight ratio is 65:35 to 25:75, particularly 60:40 to 35:65. If the ratio of component (A) in the total weight of components (A) and (B) is less than 10% by weight, the composition hardly produces a hardened product, such as a molded part and a three-dimensional object, excellent in heat resistance and rigidity on photohardening. If it exceeds 80% by weight, the composition undergoes large shrinkage on photohardening to reduce dimensional accuracy. Besides, the composition has too high a viscosity to secure handling properties and moldability or formability which hinders smooth production particularly of a three-dimensional object by stereolithography.

The photohardenable resin composition further comprises a photosensitive polymerization initiator (hereinafter referred to as a photo-initiator) as component (C). Any photo-initiators for radical polymerization that have been customarily employed in conventional photohardenable resin compositions can be used with no particular restriction. Examples of suitable photo-initiators include 2,2-dimethoxy-2-phenylacetophenone, 1-hydroxycyclohexyl phenyl ketone, diethoxyacetophenone, acetophenone, 3-methylacetophenone, 2-hydroxymethyl-1-phenylpropan-1-one, 4'-isopropyl-2-hydroxy-2-propiophenone, 2-hydroxy-2-methyl-propiophenone, p-dimethylaminoacetophenone, p-t-butyldichloroacetophenone, p-t-butyltrichloroacetophenone, p-azidobenzalacetophenone, benzophenone, methyl o-benzoylbenzoate, Michler's ketone, 4,4'-bisdiethylaminobenzophenone, xanthone, fluorenone, fluorene, benzaldehyde, anthraquinone, triphenylamine, and carbazole.

Where a radical polymerizable compound having a radical polymerizable group and a cationic polymerizable group, such as an epoxy group, is used as component (B), a photo-initiator for cationic polymerization can be used in combination with the above-described photo-initiator. The photo-initiator for cationic polymerization to be used is not particularly limited, and various compounds known in the art are usable.

The amount of the photo-initiator to be used is subject to variation according to the kinds of the urethanated acrylic compound (I), the radical polymerizable compound, and the photo-initiator for radical polymerization. In general, it is preferably used in an amount of 0.1 to 10%, particularly 1 to 5%, by weight based on the total weight of the urethanated acrylic compound (I) and the radical polymerizable compound.

While not particularly limiting, the urethanated acrylic compound (I) and the photohardenable resin composition containing the same are typically and preferably produced by a process comprising the following steps (1) to (3).

Step (1):

A (meth)acrylic ester represented by formula (III):

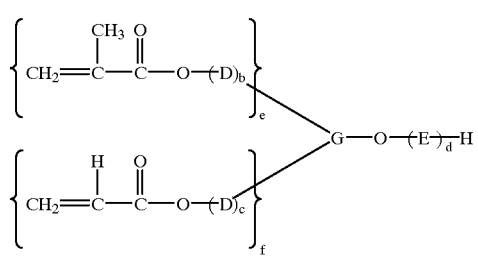

(III)

wherein D, E, G, b, c, d, e, and f are as defined above, is allowed to react with a polyisocyanate compound represented by formula (IV):

J—(NCO)$_{g+1}$ (IV)

wherein J and g are as defined above, at such a ratio that one of the isocyanate groups per molecule of the polyisocyanate compound may remain unreacted in the presence or absence of a diluent comprising a radical polymerizable compound which is different from a monoisocyanate compound represented by formula (V) below and unreactive to an isocyanate group, to obtain a reaction product comprising a monoisocyanate compound represented by formula (V):

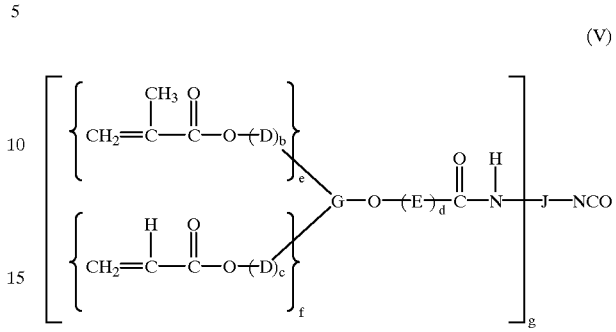

(V)

wherein D, E, G, j, b. c, d, e, f, and g are as defined above, or a reaction product comprising the monoisocyanate compound of formula (V) and the radical polymerizable compound.

In step (1), where a diisocyanate compound is used as the polyisocyanate compound (IV), the (meth)acrylic ester (III) is used in an amount of about 1.0 to 1.2 mol per mole of the diisocyanate compound to give the monoisocyanate compound (V) in which g=1. Where the compound (IV) is a triisocyanate compound, the (meth)acrylic ester (III) is used in an amount of about 2.0 to 2.4 mol per mole of the triisocyanate compound to give the monoisocyanate compound (V) in which g=2.

The polyisocyanate compound (IV) is not particularly limited. Examples of preferred polyisocyanate compounds (IV) are isophorone diisocyanate, tolylene diisocyanate, 4,4'-diphenylmethane diisocyanate, naphthylene diisocyanate, xylylene diisocyanate, phenylene diisocyanate, 3,3'-dichloro-4,4'-phenylmethane diisocyanate, toluylene diisocyanate, hexamethylene diisocyanate, 4,4'-dicyclohexylmethane diisocyanate, hydrogenated xylylene diisocyanate, triphenylmethane triisocyanate, tetramethylxylylene diisocyanate, and hydrogenated 4,4'-diphenylmethane diisocyanate. These polyisocyanate compounds can be used either individually or as a combination of two or more thereof. Isophorone diisocyanate and tolylene diisocyanate are particularly preferred of them, taking into consideration the balance between the volume shrinkage of the resulting photohardenable resin composition on photohardening and the heat resistance of the resulting hardened product such as a three-dimensional object.

The reaction between the compounds (III) and (IV) is preferably carried out in the presence of a known catalyst for urethanation, such as an organotin catalyst and a tertiary amine catalyst, at 40 to 100° C.

The reaction can be accomplished either in the presence or absence of a diluent. In cases where the (meth)acrylic ester (III) as a reactant and the monoisocyanate compound (V) as a product have high viscosity as are often experienced, it is recommended to use an appropriate diluent inert to the isocyanate group. Use of the diluent will help in heating and mixing the reactants uniformly for smooth reaction progress, resulting in obtaining the monoisocyanate compound (V) with a low viscosity. While varying depending on the kinds of the (meth)acrylic ester (III), the polyisocyanate compound (IV), and the diluent selected, the amount of the diluent to be used preferably ranges from about 10 to 65% by weight based on the total weight of the (meth)acrylic ester (III) and the polyisocyanate compound (IV).

Any organic solvent capable of dissolving the (meth) acrylic ester (III) and the polyisocyanate compound (IV) and unreactive with an isocyanate group can serve as a diluent. In particular, the diluent is desirably selected from the radical polymerizable compounds that are useful as component (B) which are not reactive with an isocyanate group. In case where such an isocyanate-unreactive radical polymerizable compound is used as a diluent, there is no necessity to remove the diluent from the resulting reaction mixture. That is, the reaction product as containing the radical polymerizable compound as the diluent can be subjected to step (2) as it is. In step (2), too, the diluent contributes to smooth reaction progress, and the reaction product as obtained in step (2), which contains the urethanated acrylic compound (I) and the radical polymerizable compound, can be used as such in the production of the photohardenable resin composition of the invention.

Where a radical polymerizable compound is used as a diluent in step (1), the amount of the diluent comprising the radical polymerizable compound is selected so as to help the reaction of step (1) proceed smoothly and not to exceed the predetermined ratio in the photohardenable resin composition finally formulated in step (3), that is, the radical polymerizable compound added as a diluent may correspond to a part of, or the whole of the radical polymerizable compound present in the photohardenable resin composition as component (B).

Specific but non-limiting examples of the diluents which can be preferably used in step (1) include radical polymerizable compounds, such as morpholine acrylamide, dicyclopentanyl diacrylate, phenoxydiethyl acrylate, and N-vinylcaprolactam, with morpholine acrylamide and dicyclopentanyl diacrylate being particularly preferred. These diluents can be used either individually or as a combination of two or more thereof. Step (2):

The reaction product as obtained in step (1) comprising the monoisocyanate compound (V) or a mixture of the monoisocyanate compound (V) and the diluent, such as the radical polymerizable compound, is mixed with and allowed to react with a polyol compound represented by formula (VI):

$$(H\text{—}O\text{—}L\text{—}CH_2)_a\text{—}C\text{—}(R)_{4-a} \quad (VI)$$

wherein R, L, and a are as defined above, at such a ratio that the residual isocyanate group in the monoisocyanate compound (V) and the hydroxyl groups in the polyol compound (VI) may react at a ratio 1:1 to obtain a reaction product comprising a urethanated acrylic compound (I) or a reaction product comprising the urethanated acrylic compound (I) and the radical polymerizable compound.

In step (2), where the polyol compound (VI) is a triol compound (a=3), the monoisocyanate compound (V) is allowed to react at a molar ratio of about 3.0 to 3.6 to the triol compound to give a urethanated acrylic compound (I) wherein a=3. Where the polyol compound (VI) is a tetraol compound (a=4), the monoisocyanate compound (V) is allowed to react at a molar ratio of about 4.0 to 4.8 to the tetraol compound to give a urethanated acrylic compound (I) wherein a=4.

The polyol compound (VI) is not particularly limited. Typical examples of useful polyol compounds (VI) include a pentaerythritol ethylene oxide adduct having 1 to 4 mol of ethylene oxide added to each of the four hydroxyl groups thereof, a pentaerythritol propylene oxide adduct having 1 to 4 mol of propylene oxide added to each of the four hydroxyl groups thereof, a pentaerythritol ethylene oxide-propylene oxide adduct having 1 to 4 mol of ethylene oxide and propylene oxide added to each of the four hydroxyl groups thereof, a trimethylolpropane ethylene oxide adduct having 1 to 4 mol of ethylene oxide added to each of the three hydroxyl groups thereof, a trimethylolpropane propylene oxide adduct having 1 to 4 mol of propylene oxide added to each of the three hydroxyl groups thereof, and a trimethylolpropane ethylene oxide-propylene oxide adduct having 1 to 4 mol of ethylene oxide and propylene oxide added to each of the three hydroxyl groups thereof.

The reaction in step (2) can be carried out generally at 40 to 100° C. in the presence of, if desired, a cationic catalyst, an anionic catalyst, an organotin catalyst, etc. to efficiently give a urethanated acrylic compound (I). If necessary, the same diluent as used in step (1) may be added in step (2).

The urethanated acrylic compound (I) obtained in step (2) have different properties according to the kinds of groups A and R and the number of a in formula (I), particularly the kinds of D, E, G, J, and L and the numbers of b, c, d, e, f, and g in group A, and the like. Generally speaking, the compound (I) is liquid of low to high viscosity at ambient temperature. Inter alia, the reaction product comprising the urethanated acrylic compound (I) and the radical polymerizable compound is liquid of low to middle viscosity which has excellent handling properties. Step (3):

In step (3), the reaction product obtained in step (2) which comprises the urethanated acrylic compound (I) or a mixture of the urethanated acrylic compound (I) and the radical polymerizable compound is formulated into the photohardenable resin composition of the invention in accordance with any of the following methods (i) to (iv).

(i) Where the reaction product as obtained in step (2) contains no radical polymerizable compound, it is mixed with at least one radical polymerizable compound other than the urethanated acrylic compound (I) as component (B) to make the (A) to (B) weight ratio 80:20 to 10:90, and a photo-initiator is added thereto as component (C) to obtain the photohardenable resin composition of the invention.

(ii) Where the reaction product obtained in step (2) contains the urethanated acrylic compound (I) and a diluent other than the radical polymerizable compound, the diluent is removed, and the urethanated acrylic compound (I) is mixed with at least one radical polymerizable compound other than the urethanated acrylic compound (I) as component (B) to make the (A) to (B) weight ratio 80:20 to 10:90. A photo-initiator (C) is added to the mixture to obtain the photohardenable resin composition of the invention.

(iii) Where the reaction product obtained in step (2) already contains the radical polymerizable compound, which has been used as a diluent, at such a weight ratio as intended for the final photohardenable resin composition, it is mixed with a photo-initiator as component (C) to obtain the photohardenable resin composition of the invention having the (A) to (B) weight ratio of 80:20 to 10:90.

(iv) Where the reaction product obtained in step (2) contains the radical polymerizable compound (diluent) in a less amount than desired, at least one radical polymerizable compound other than the urethanated acrylic compound (I) is added thereto to adjust the (A) to (B) weight ratio to 80:20 to 10:90, and a photo-initiator (C) is added to prepare the photohardenable resin composition of the invention.

If desired, the photohardenable resin composition of the invention can further comprise (D) at least one filler selected from solid particles and whiskers. The composition containing component (D) exhibits further improved resistance to volume shrinkage on photohardening to provide a molded part or a three-dimensional object with improved dimensional accuracy. Further, the molded part or three-dimensional object obtained therefrom has a markedly elevated heat distortion temperature while maintaining the satisfied mechanical characteristics.

Component (D) may be solid particles of one or more than one kinds and/or whiskers of one or more than one kinds. The photohardenable resin composition containing both solid particles of one or more than one kinds and whiskers of one or more than one kinds exhibits particularly improved resistance against hardening shrinkage to provide a photohardened product excellent in dimensional accuracy and heat resistance having a markedly heightened heat distortion temperature.

The amount of component (D) (the total amount of the solid particles and/or whiskers) to be added is subject to variation according to the kind or form of the solid particles and whiskers. In general, it is preferably in the range of 3 to 70% by volume, particularly 20 to 65% by volume, especially 30 to 60% by volume, based on the volume of the photohardenable resin composition before addition of component (D). Where component (D) consists solely of solid particles, it is preferably added in an amount of 3 to 70% by volume based on the volume of the composition before addition. Where component (D) consists solely of whiskers, a preferred amount is 3 to 30% by volume on the same basis.

With the content of component (D) falling within the above-specified preferred ranges, the improvements on dimensional accuracy and heat resistance of photohardened products can further be assured. If the content of component (D) exceeds the above specified preferred upper limit, the resulting resin composition tends to have an excessively increased viscosity, which may deteriorate the handling properties or operational properties on photohardening.

The solid particles which can be used as filler (D) include inorganic solid particles and organic polymer solid particles. It is preferred for the solid particles to have a smooth surface, hardly causing irregular reflection when irradiated with energy rays, and to undergo no decomposition or denaturation at temperatures at which the resulting photohardened products are used. Spherical particles with a smooth surface whose sphericity has a relative standard deviation of 0.5 or smaller as calculated by equation (1) shown below, especially truly spherical particles are preferred.

Relative standard deviation of sphericity=

$$\sqrt{\frac{\left(\sum_{i}^{n} \frac{(D_i - D)^2}{n}\right)}{D}} \quad (1)$$

wherein Di is a projected area diameter ($\mu$m) of individual particles; D is an average projected area diameter ( $$\left(\sum_{i}^{n} D_i / n; \mu m\right);$$

and n is the number of particles.

Where such solid particles as have the relative standard deviation of 0.5 or smaller are used, irregular reflection of energy rays used for photohardening can be prevented so that photohardening proceeds uniformly to provide a photohardened product with high dimensional accuracy. Additionally, an excessive increase in viscosity of the photohardenable resin composition can be avoided.

From the viewpoint of the balance among reinforcing effect, formability, dimensional accuracy, and the like, it is preferred for the solid particles to have an average particle size of 3 to 70 $\mu$m, particularly 10 to 60 $\mu$m, especially 15 to 50 $\mu$m. Particles smaller than 3 $\mu$m in average size tend to make the resin composition too viscous. Particles greater than 70 $\mu$m in average tend to cause the active energy to scatter when irradiated, and the resulting hardened product tends to have low dimensional accuracy.

The solid particles may be either transparent or opaque, which can be chosen appropriately according to the type or the intended use of the product.

Where it is desired to obtain a transparent photohardened product with improved heat resistance, it is possible to use extremely small particles of submicron order by subjecting the particles to an appropriate surface treatment so that the particles may be dispersed in the resin composition stably while minimizing a resultant increase in viscosity.

Examples of solid particles which are preferably used as component (D) include inorganic ones, such as glass beads, talc powder, and silicon oxide particles; and organic polymer particles, such as crosslinked polystyrene particles, crosslinked polymethacrylate particles, polyethylene particles, and polypropylene particles. As stated previously, these solid particles can be used either individually or as a mixture of two or more thereof or in combination with whiskers.

It is a preferred embodiment that the solid particles be treated with at least one silane coupling agent, such as aminosilane, epoxysilane and acrylsilane coupling agents, to often bring about improvement on the mechanical strength of the resulting photohardened product. Where polyethylene and/or polypropylene particles are used as treated with the silane coupling agent, it is preferred to use ethylene and/or propylene copolymer comprising about 1 to 10% by weight of an acrylic acid compound as a comonomer as the solid particles because of their satisfied affinity to the silane coupling agent.

Cases are sometimes met with, in which incorporation of the solid particles into the photohardenable resin composition results in development of rheological thixotropy. In such cases, thixotropy can be eliminated by addition of a phosphate surface active agent. The phosphate surface active agent for this purpose preferably includes salts formed of an acid phosphoric ester and a monoamine, for example, salts of an acid phosphoric ester with monoethanolamine, triethanolamine, $\beta$-aminoisopropyl alcohol, methyldiethanolamine, ethylmonoethanolamine, butyldiethanolamine, morpholine, and pyridine, and mixtures thereof. The phosphate surface active agent is preferably added in an amount of about 0.01 to 1% by weight based on the solid particles.

Where whiskers are used as component (D), it is preferred to use whiskers having a diameter of 0.3 to 1 $\mu$m, a length of 10 to 70 $\mu$m, and an aspect ratio of 10 to 100. It is still preferred to use whiskers having a diameter of 0.3 to 0.7 $\mu$m, a length of 20 to 50 $\mu$m, and an aspect ratio of 20 to 70. Whisker whose aspect ratio of less than 10 produces hardly produces substantial effects in improving the mechanical characteristics and reducing the volume shrinkage, only to incur an increase in viscosity of the resulting resin composition.

As the aspect ratio increases, enhanced improvement in mechanical strength and reduction in shrinkage are expected, but too large an aspect ratio may result in an increased viscosity of the resin composition and an increased fluid elasticity, which will make shaping operation and the like difficult or deteriorate the dimensional accuracy of the resulting photohardened product, especially the dimensional accuracy of the side of the product. Therefore, the aspect ratio is preferably 100 or less, still preferably 70 or less.

The whiskers which can be used in the invention as component (D) include aluminum borate whiskers, $MgSO_4 \cdot 5Mg(OH)_2 \cdot 3H_2O$ whiskers, aluminum oxide whiskers, titanium oxide whiskers, and silicon oxide whiskers. These kinds of whiskers can be used either individually or as a combination thereof.

It is often preferred that the whiskers be treated with at least one silane coupling agent, such as an aminosilane, epoxysilane or acrylsilane coupling agent, to ensure the improvement on mechanical strength.

The photohardenable resin composition containing component (D) is prepared by uniformly mixing the solid particles and/or whiskers into the photohardenable resin composition obtained in step (3).

If desired, the photohardenable resin composition of the invention can contain other additives, such as leveling agents, surface active agents, modifiers comprising organic polymers, organic plasticizers, and so on.

The photohardenable resin composition can have its viscosity adjusted in conformity with the application or mode of application as intended. In general, the viscosity preferred for the handling properties, moldability and formability in stereolithography is in the range of from about 100 to 100,000 cp at room temperature (25° C.) as measured with a B-type rotational viscometer. For use in stereolithography, in particular, the composition preferably has the viscosity of 300 to 50,000 cp at room temperature from the standpoint of handling properties and dimensional accuracy. The viscosity can be adjusted by proper selection of the urethanated acrylic compound (I) and the radical polymerizable compound and their compounding ratio.

The photohardenable resin composition of the present invention sustains its satisfied photohardening properties without suffering from denaturation or polymerization at a temperature of 10 to 40° C. for a storage period as long as about 6 to 18 months as far as it is stored under light shielding conditions.

The photohardenable resin composition of the invention is applicable to a wide variety of uses taking advantage of its excellent characteristics, particularly low volume shrinkage on photohardening and capability of producing various hardened products with high dimensional accuracy which exhibit excellent heat resistance due to a high heat distortion temperature and high transparency. For instance, the composition is applicable to manufacturing of three-dimensional objects by stereolithography, manufacturing of various molded articles, such as films or solid objects, by casting or injection molding, and coating.

The transparent photohardenable resin composition of the invention, which does not contain a filler, preferably has a volume shrinkage on photohardening of 7.5% or less, more preferably 7.2% or less, particularly preferably 7.0% or less, according to Archimedes method. The transparent photohardenable resin composition of the invention, which does not contain a filler, preferably has a heat distortion temperature of 100° C. or more, more preferably 115° C. or more, particularly preferably 120° C. or more, according to JIS K7207 (1995), which corresponds to ASTM D648. The transparent photohardenable resin composition of the invention, which does not contain a filler, preferably has a viscosity (at room temperature) of 2,000 cp or less, more preferably 1,000 cp or less.

The opaque photohardenable resin composition of the invention, which contains a filler, preferably has a volume shrinkage on photohardening of 4.0% or less, more preferably 2.0% or less, according to Archimedes method. The opaque photohardenable resin composition of the invention, which contains a filler, preferably has a heat distortion temperature of 200° C. or more, more preferably 250° C. or more, according to JIS K7207 (1995) which corresponds to ASTM D648.

The photohardenable resin composition of the invention is particularly suited to stereolithography. It achieves smooth production of three-dimensional objects excellent in dimensional accuracy, heat resistance, rigidity, and transparency while minimizing volume shrinkage on photohardening.

In carrying out stereolithography using the photohardenable resin composition of the invention, any methods and systems known in the art of stereolithography can be employed with no particular restriction. It is preferred to use actinic energy rays emitted from an Ar laser, an He-Cd laser, a xenon lamp, a metal halide lamp, a mercury lamp, a fluorescent tube, etc. as light energy for hardening the photohardenable resin. A laser beam is particularly suitable; for the energy level can be increased to reduce the forming time, and the satisfied focusing character of a laser beam can be made use of to provide a three-dimensional object of high forming accuracy. Stereolithography using the photohardenable resin composition of the invention is typically carried out by selectively applying actinic light energy rays to the liquid photohardenable resin composition so as to provide a hardened layer having a desired pattern, supplying the liquid photohardenable resin composition on the hardened layer, followed by applying the actinic energy rays to successively form a hardened layer which is integrally connected to the preceding hardened layer, and repeating these steps repeated until the entire three-dimensional object is built up. The resulting three-dimensional object may be used either as such or, in some cases, after it is subjected to post-hardening by irradiation or heating to further improve the mechanical characteristics and dimensional stability.

The structure, shape, and size of the three-dimensional objects to be formed are not limited and can be determined depending on the end use. The present invention is typically applicable to production of prototypes for verification of a design model or for inspecting functions of parts, resin models for manufacturing casting molds, base models for manufacturing dies, and direct molding dies for producing trial products. More specifically, the present invention is applicable to production of models or models for processing for precision parts, electric and electronic parts, furniture, constructional structures, automobile parts, various containers, casting molds, dies, and master molds. The satisfied heat resistance and transparency of the resulting three-dimensional objects can be made effective use of in the preparation of trial products, such as the parts for designing of a complicated heating medium circuit or analysis and programming of the behavior of a heating medium having a complicated structure.

The invention will now be illustrated in greater detail with reference to Examples, but it should be understood that the invention is not construed as being limited thereto.

SYNTHESIS EXAMPLE 1

Preparation of Reaction Product Comprising Urethanated Acrylic Compound (I) and Radical Polymerizable Compound (1) In a four-necked flask were charged 187.2 g (1.3 mol) of an acrylic acid dimer (Aronix m-566, produced by Toa Gosei) and 142 g (1.0 mol) of diglycidyl methacrylate, and 33 g of triethylamine (catalyst) and 0.28 g of methylhydroquinone (polymerization inhibitor) were added thereto. The mixture was allowed to react by stirring at 80 to 85° C. for 5 hours. To the reaction mixture was added 420 g of toluene, and the reaction product was washed successively with 88 g of 15% aqueous sodium hydroxide, 100 ml of water, and 300 ml of 1N hydrochloric acid. The product was further washed with 100 ml portions of water repeatedly until the washing became neutral. The product was dried over anhydrous sodium sulfate, and the solvent was evaporated under reduced pressure to give glycerol (meth)acrylate represented by formula (XIII):

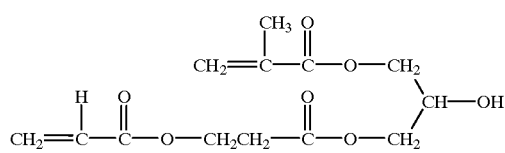

(XIII)

(2) In a 5 liter three-necked flask equipped with a stirrer, a temperature controller, a thermometer, and a condenser were put 888 g of isophorone diisocyanate, 906 g of morpholine acrylamide, and 1.0 g of dibutyltin dilaurate, and the mixture was heated on an oil bath to 80 to 90° C.

(3) A uniform solution of 0. 7 g of methylhydroquinone in 1161 g of the glycerol (meth)acrylate (XIII) obtained in (1) above was put in a dropping funnel with a side tube which had previously been warmed to 50° C. and dropped into the flask of (2) while keeping the contents of the flask at 80 to 90° C. with stirring in a nitrogen atmosphere, followed by allowing to react at that temperature for 2 hours while stirring.

(4) The temperature of the contents of the flask was dropped to 60° C., and 366 g of a pentaerythritol propylene oxide (4 mol) adduct (having 1 mol of propylene oxide added to each of the four hydroxyl groups of pentaerythritol) put in another dropping funnel was quickly added thereto dropwise, and the mixture was allowed to react at 80 to 90° C. for 4 hours to produce a reaction product comprising a urethanated acrylic compound (I) and a radical polymerizable compound (morpholine acrylamide). The resulting reaction product was taken out of the flask while hot.

(5) The resulting reaction product was a colorless and viscous liquid at room temperature (25° C.). The urethanated acrylic compound (I) contained in the reaction product was identified to be a compound represented by formula (XIV) in which $J^1$ is an isophorone group; and n is 1.

SYNTHESIS EXAMPLE 2

Preparation of Reaction Product Containing Urethanated Acrylic Compound (I) and Radical Polymerizable Compound (1) In a 5 liter three-necked flask equipped with a stirrer, a temperature controller, a thermometer, and a condenser were charged 696 g of tolylene diisocyanate, 906 g of morpholine acrylamide, and 1.0 g of dibutyltin dilaurate, and the mixture was heated to 80 to 90° C. on an oil bath.

(2) A uniform solution of 0.7 g of methylhydroquinone in 1161 g of the glycerol (meth)acrylate (XIII) obtained in Synthesis Example 1-(1) was put in a dropping funnel with a side tube which had previously been warmed to 50° C. and dropped into the flask of (1) above while keeping the contents of the flask at 80 to 90° C. with stirring in a nitrogen atmosphere, followed by allowing to react at that temperature for 2 hours while stirring.

(3) The temperature of the contents of the flask was dropped to 60° C., and 366 g of a pentaerythritol propylene oxide (4 mol) adduct (having 1 mol of propylene oxide added to each of the four hydroxyl groups of pentaerythritol) put in another dropping funnel was quickly added thereto dropwise, and the mixture was allowed to react at 80 to 90° C. for 4 hours to produce a reaction product comprising a urethanated acrylic compound (I) and a radical polymerizable compound (morpholine acrylamide). The resulting reaction product was taken out of the flask while hot.

(4) The resulting reaction product was a colorless and viscous liquid at room temperature (25° C.). The urethanated acrylic compound (I) contained in the reaction product was identified to be a compound represented by formula (XIV) in which $J^1$ is a tolylene group; and n is 1.

SYNTHESIS EXAMPLE 3

Preparation of Reaction Product Comprising Urethanated Acrylic Compound (I) and Radical Polymerizable Compound (1) A reaction product was obtained in the same manner as in Synthesis Example 1-(2) and (3).

(2) The temperature of the reaction product in the flask as obtained in (1) above was dropped to 60° C., and 578 g of a pentaerythritol propylene oxide (8 mol) adduct (having 2 mol of propylene oxide added to each of the four hydroxyl groups of pentaerythritol) put in another dropping funnel was quickly added thereto dropwise, and the mixture was allowed to react at 80 to 90° C. for 4 hours to produce a reaction product comprising a urethanated acrylic compound (I) and a radical polymerizable compound (morpholine acrylamide). The resulting reaction product was taken out of the flask while hot.

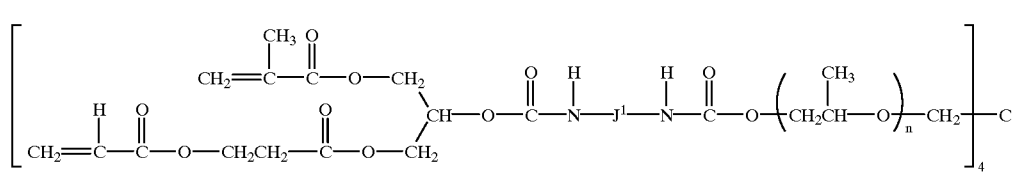

(XIV)

(3) The resulting reaction product was a colorless and viscous liquid at room temperature (25° C.). The urethanated acrylic compound (I) contained in the reaction product was identified to be a compound represented by formula (XIV) in which $J^1$ is an isophorone group; and n is 2.

SYNTHESIS EXAMPLE 4

Preparation of Reaction Product Comprising Urethanated Acrylic Compound (I) and Radical Polymerizable Compound (1) To a 2 liter reactor equipped with a stirrer, a cooling tube, and a dropping funnel having a side tube was put 856 g (4 mol) of glycerol monomethacrylate monoacrylate, and 0.11 g of p-benzoquinone (stabilizer) and 3.0 g of boron trifluoride triethyl etherate (catalyst) were added thereto, followed by heating up to 40° C. while stirring. To the mixture was added dropwise 255 g (4.4 mol) of propylene oxide over a 2 hour period while taking care that the inner temperature might not exceed 90° C. After the addition, the reaction mixture was kept at 80° C. for 1 hour and then cooled to 60° C. To the reaction mixture was added 30 g of magnesium hexasilicate hydrate (Kyoward 600, supplied by Kyowa Kagaku Kogyo), and the mixture was stirred for 1 hour, followed by filtration to collect 1050 g of the reaction product. The reaction product was found to have an acid value of 0.2 and a hydroxyl value of 205. The reaction product was glycerol monomethacrylate monoacrylate having 1.03 mol, in average, of propylene oxide added to the remaining hydroxyl group.

(2) In a 2 liter reactor equipped with a stirrer, a cooling tube, and a dropping funnel with a side tube were charged 666 g (3 mol) of isophorone diisocyanate, 755 g of morpholine acrylamide, and 0.8 g of dibutyltin dilaurate, and the mixture was heated to an inner temperature of 80° C. To the mixture was added dropwise 821 g (3 mol) of the propylene oxide adduct of glycerol monomethacrylate monoacrylate prepared in (1) above over 2 hours to react. The inner temperature was dropped to 60° C., and 276 g of a pentaerythritol propylene oxide (4 mol) adduct was quickly added thereto dropwise, and the mixture was allowed to react at 80 to 90° C. for 4 hours to produce a reaction product comprising a urethanated acrylic compound (I) and morpholine acrylamide.

(5) The resulting reaction product was a colorless and viscous liquid at room temperature (25° C.). The urethanated acrylic compound (I) contained in the reaction product was identified to be a compound represented by formula (XV) in which $J^1$ is an isophorone group.

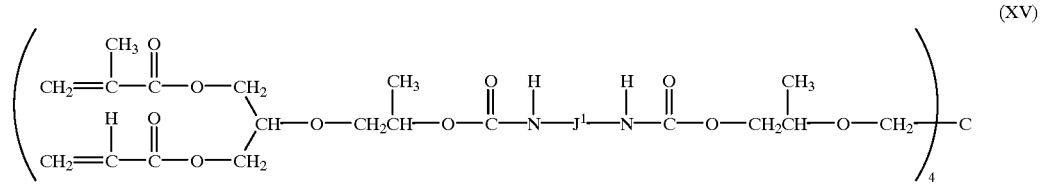

SYNTHESIS EXAMPLE 5

Preparation of Reaction Product Comprising Urethanated Acrylic Compound and Radical Polymerizable Compound (1) In a 5 liter three-necked flask equipped with a stirrer, a temperature controller, a thermometer, and a condenser were charged 888 g of isophorone diisocyanate, 906 g of morpholine acrylamide, and 1.0 g of dibutyltin dilaurate, and the mixture was heated to 80 to 90° C. on an oil bath.

(2) A uniform solution of 0.7 g of methylhydroquinone in 856 g of the glycerol monomethacrylate monoacrylate was put in a dropping funnel with a side tube previously warmed to 50° C. and dropped into the flask of (1) above while maintaining the contents of the flask at 80 to 90° C. with stirring in a nitrogen atmosphere, followed by allowing to react at that temperature for 2 hours while stirring.

(3) The temperature of the contents of the flask was dropped to 60° C., and 1520 g of a pentaerythritol propylene oxide (24 mol) adduct (having 6 mol, in average, of propylene oxide added to each of the four hydroxyl groups of pentaerythritol) put in another dropping funnel was quickly added thereto dropwise, and the mixture was allowed to react at 80 to 90° C. for 4 hours to produce a reaction product comprising a urethanated acrylic compound and a radical polymerizable compound (morpholine acrylamide). The resulting reaction product was taken out of the flask while hot.

(4) The resulting reaction product was a colorless and viscous liquid at room temperature (25° C.). The urethanated acrylic compound contained in the reaction product was identified to be a compound represented by formula (XVI) in which J¹ is an isophorone group; and n is 6.

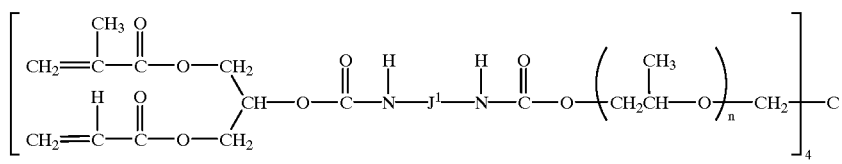

(XVI)

SYNTHESIS EXAMPLE 6

Preparation of Reaction Product Comprising Urethanated Acrylic Compound and Radical Polymerizable Compound (1) The same procedures of Synthesis Example 5-(1) and (2) were repeated to obtain a reaction product, which comprised a reaction product between isophorone diisocyanate and glycerol monomethacrylate monoacrylate and morpholine acrylamide, in a flask.

(2) The temperature of the contents of the flask was dropped to 60° C., and 135 g of pentaerythritol put in another dropping funnel was quickly added thereto dropwise, and the mixture was allowed to react at 80 to 90° C. for 4 hours to produce a reaction product comprising a urethanated acrylic compound and a radical polymerizable compound (morpholine acrylamide). The resulting reaction product was taken out of the flask while hot.

(3) The resulting reaction product was a colorless and viscous liquid at room temperature (25° C.). The urethanated acrylic compound contained in the reaction product was identified to be a compound represented by formula (XVI) in which J¹ is an isophorone group; and n is 0.

EXAMPLE 1

Preparation of Photohardenable Resin Composition, Photohardening Molding, and Stereolithography (1) Preparation of Photohardenable Resin Composition In a 5 liter three-necked flask equipped with a stirrer, a cooling tube, and a dropping funnel with a side tube were charged 1500 g of the reaction product obtained in Synthesis Example 1, which comprised the urethanated acrylic compound (I) and the radical polymerizable compound, 900 g of morpholine acrylamide, and 600 g of dicyclopentanyl diacrylate, and the atmosphere was evacuated and displaced with nitrogen. In a UV-shielded environment, 118 g of 1-hydroxycyclohexyl phenyl ketone (Irgacure 184, a photoinitiator for radical polymerization produced by Ciba-Geigy, Ltd.) was added thereto. The mixture was stirred at 25° C. until the photo-initiator dissolved completely (for about 1 hour) to obtain a photohardenable resin composition as a colorless, transparent and viscous liquid. The viscosity of the composition was about 570 cp at room temperature.

(2) Photohardening Molding (i) The photohardenable resin composition obtained in (1) above was injected into a transparent silicone mold having a cavity corresponding to a dumbbell specimen specified in JIS K7113 (1995), which corresponds to ASTM D638, and irradiated with UV rays from a 30W UV lamp for 15 minutes from every side of the mold to produce a transparent dumbbell specimen. The specimen was taken out of the mold and subjected to a tensile test in accordance with JIS K7113 (1995). The tensile characteristics, i.e., tensile strength, tensile elongation and tensile modulus, of the specimen are shown in Table 1 below.

(ii) The heat distortion temperature of the dumbbell specimen prepared above was measured in accordance with A method of JIS K7207 (1995) (load: 18.5 kg/mm²). JIS K7207 (1995) corresponds to ASTM D648. The result obtained is shown in Table 1.

(iii) The specific gravity of the photohardenable resin composition prepared in (1) above was measured before ($d_1$) and after ($d_2$) the photohardening to obtain the volume shrinkage percentage according to equation (2) The results obtained are shown in Table 1.

Volumetric shrinkage percentage (%)=(1-($d_1/d_2$))×100 (2)

(3) Stereolithography (i) A dumbbell specimen specified in JIS K7113 (1995) was fabricated by stereolithography using the resin composition prepared in (1) above. Stereolithography was carried out by means of an ultra-high speed stereolithography system ("SOLIFORM 300" produced by Teijin Seiki Co., Ltd.). A beam of a water-cooled Ar laser (output: 500 mW; wavelength: 333, 351, and 364 nm) was applied vertically to the liquid surface of the resin composition under conditions of an exposure energy of 20 to 30 mJ/cm², a slice pitch (hardened layer thickness) of 0.127 mm, and an average forming time of 2 minutes per layer. The resulting green three-dimensional object (dumbbell specimen) was cleaned with isopropyl alcohol to remove any unhardened resin and then subjected to post-hardening by irradiating with 3 kW UV rays for 10 minutes to obtain a three-dimensional object having excellent transparency. The tensile characteristics, i.e., tensile strength, tensile elongation, and tensile modulus, of the object measured in accordance with JIS K7113 (1995) are shown in Table 1.

(ii) The heat distortion temperature of the post-hardened dumbbell specimen as measured in the same manner as described above was as shown in Table 1.

(iii) The volume shrinkage percentage of the photohardenable resin composition upon stereolithography was obtained in the same manner as described above. The results obtained are shown in Table 1.

EXAMPLE 2

Preparation of Photohardenable Resin Composition and Stereolithography (1) Preparation of Photohardenable Resin Composition In a 5 liter three-necked flask equipped with a stirrer, a cooling tube, and a dropping funnel with a side tube were charged 2000 g of the reaction product obtained in Synthesis Example 2, which comprised the urethanated acrylic compound (I) and the radical polymerizable compound, 600 g of morpholine acrylamide, and 1400 g of dicyclopentanyl diacrylate, and the atmosphere was evacuated and displaced with nitrogen. In a UV-shielded environment, 133 g of 1-hydroxycyclohexyl phenyl ketone (Irgacure 184) was added thereto, and the mixture was stirred at 25° C. until the photo-initiator dissolved completely (for about 1 hour) to obtain a photohardenable resin composition as a colorless, transparent and viscous liquid. The viscosity of the composition was about 900 cp at room temperature.

(2) Stereolithography

A three-dimensional object (dumbbell specimen) was fabricated by stereolithography in the same manner as in Example 1-(3), except for using the photohardenable resin composition prepared in (1) above. The green three-dimensional object was cleared of the unhardened resin composition and post-hardened in the same manner as in Example 1-(3). The tensile characteristics and heat distortion temperature of the specimen and the shrinkage percentage were measured in the same manner as in Example 1. The results obtained are shown in Table 1.

EXAMPLE 3

Preparation of Photohardenable Resin Composition and Stereolithography (1) Preparation of Photohardenable Resin Composition A photohardenable resin composition was prepared in the same manner as in Example 1-(1), except for using the reaction product obtained in Synthesis Example 3, which comprised the urethanated acrylic compound (I) and the radical polymerizable compound. The resulting composition was colorless, transparent, and viscous liquid having a viscosity of about 800 cp at room temperature.

(2) Stereolithography

A three-dimensional object (dumbbell specimen) was fabricated by stereolithography in the same manner as in Example 1-(3), except for using the photohardenable resin composition prepared in (1) above. The green three-dimensional object was cleared of the unhardened resin composition and post-hardened in the same manner as in Example 1-(3). The tensile characteristics, heat distortion temperature, and volume shrinkage percentage of the specimen as measured in the same manner as in Example 1 are shown in Table 1.

EXAMPLE 4

Preparation of Photohardenable Resin Composition and Stereolithography (1) Preparation of Photohardenable Resin Composition A photohardenable resin composition was prepared in the same manner as in Example 1-(1), except for using the reaction product obtained in Synthesis Example 4, which comprised the urethanated acrylic compound (I) and the radical polymerizable compound. The resulting composition was colorless, transparent, and viscous liquid having a viscosity of about 800 cp at room temperature.

(2) Stereolithography

A three-dimensional object (dumbbell specimen) was fabricated by stereolithography in the same manner as in Example 1-(3), except for using the photohardenable resin composition prepared in (1) above. The green three-dimensional object was cleared of the unhardened resin composition and post-hardened in the same manner as in Example 1-(3). The tensile characteristics, heat distortion temperature, and volume shrinkage percentage of the specimen as measured in the same manner as in Example 1 are shown in Table 1.

EXAMPLE 5

Preparation of Photohardenable Resin Composition and Stereolithography (1) preparation of photohardenable resin composition In a 10 liter universal stirrer (manufactured by Dulton) was put 2800 g of the photohardenable resin composition obtained in Example 1-(1), and 3310 g of glass beads having an average particle size of 15 µm and a relative standard deviation of sphericity of 0.3 (as calculated according to equation (1)) which had been treated with an acrylsilane coupling agent (γ-(methacryloxypropyl)trimethoxysilane, available from Toshiba Silicone) and 993 g of aluminum borate whiskers (Alborex YS-4, supplied by Shikoku Chemicals Corp.) having a diameter of 0.5 to 0.7 µm and an aspect ratio of 50 to 70 which had been treated with the same acrylsilane coupling agent were added as fillers to the resin composition. The amounts of the glass beads and the aluminum borate whiskers added as fillers correspond to 32% by volume and 8% by volume, respectively, based on the volume of the photohardenable resin composition before addition of the fillers. The mixture was stirred for one day and degassed to afford a photohardenable resin composition containing fillers and having a viscosity of about 20,000 cp at 25° C.

(2) Stereolithography

A three-dimensional object (dumbbell specimen) was fabricated by stereolithography in the same manner as in Example 1-(3), except for using the photohardenable resin composition prepared in (1) above. The green three-dimensional object was cleared of the unhardened resin composition and post-hardened in the same manner as in Example 1-(3). The tensile characteristics, heat distortion temperature, and volume shrinkage percentage of the specimen as measured in the same manner as in Example 1 are shown in Table 1.

COMPARATIVE EXAMPLE 1

Preparation of Photohardenable Resin Composition and Stereolithography (1) Preparation of Photohardenable Resin Composition A photohardenable resin composition was prepared in the same manner as in Example 1-(1), except for using the reaction product obtained in Synthesis Example 5, which comprised a urethanated acrylic compound out of the range of the present invention and the radical polymerizable compound. The resulting composition was colorless, transparent, and viscous liquid having a viscosity of about 2,000 cp at room temperature.

(2) Stereolithography

A three-dimensional object (dumbbell specimen) was fabricated by stereolithography in the same manner as in Example 1-(3), except for using the photohardenable resin composition prepared in (1) above. The green three-dimensional object was cleared of the unhardened resin composition and post-hardened in the same manner as in Example 1-(3). The tensile characteristics, heat distortion temperature, and volume shrinkage percentage of the specimen as measured in the same manner as in Example 1 are shown in Table 1.

COMPAPATIVE EXAMPLE 2

Preparation of Photohardenable Resin Composition and Stereolithography (1) Preparation of Photohardenable Resin Composition A photohardenable resin composition was prepared in the same manner as in Example 1-(1), except for using the reaction product obtained in Synthesis Example 5, which comprised the urethanated acrylic compound out of the range of the present invention and the radical polymerizable compound. The resulting composition was colorless, transparent, and viscous liquid having a viscosity of about 200,000 cp at room temperature.

(2) Stereolithography

The photohardenable resin composition prepared in (1) above was too viscose to use for stereolithography. Hence, it was injected into a transparent silicone mold and photo-hardened in the same manner as in Example 1-(2) to obtain a dumbbell specimen specified in JIS K7113 (1995). The tensile characteristics, heat distortion temperature, and volume shrinkage percentage of the resulting molded specimen were measured in the same manner as in Example 1. The results obtained are shown in Table 1.

composition undergoes considerable volume shrinkage on photohardening, and the resulting hardened product has an extremely small tensile strength (poor strength) and an extremely small tensile elongation (poor toughness).

While the invention has been described in detail and with reference to specific examples thereof, it will be apparent to

TABLE 1

|  |  |  | Physical Properties of Hardened Product | | | | Volumetric |
| --- | --- | --- | --- | --- | --- | --- | --- |
| Example No. | Reaction Product* | Production Process | Tensile Strength (kg/mm$^2$) | Tensile Elongation (%) | Tensile Modulus (kg/mm$^2$) | Heat Distortion Temp. (°C.) | Shrinkage on Photo-hardening (%) |
| Example 1 | Synthesis Example 1 | molding | 8.5 | 3.0 | 342 | 128 | 7.0 |
|  | Synthesis Example 1 | stereo-lithography | 9.4 | 3.5 | 306 | 125 | 6.8 |
| Example 2 | Synthesis Example 2 | stereo-lithography | 9.1 | 4.1 | 327 | 120 | 6.7 |
| Example 3 | Synthesis Example 3 | stereo-lithography | 8.9 | 3.0 | 357 | 135 | 7.2 |
| Example 4 | Synthesis Example 4 | stereo-lithography | 8.8 | 5.7 | 312 | 118 | 6.5 |
| Example 5 | Synthesis Example 1 | stereo-lithography | 8.3 | 1.0 | 1478 | 278 | 1.8 |
| Compara. Example 1 | Synthesis Example 5 | stereo-lithography | 4.5 | 7.0 | 279 | 58 | 6.2 |
| Compara. Example 2 | Synthesis Example 6 | molding | 4.5 | 0.5 | 379 | 158 | 9.8 |

Note:
*Comprising a urethanated acrylic compound and a radical polymerizable compound.

It is apparent from the results in Table 1 that the photohardenable resin compositions of Examples 1 to 4 which comprise the urethanated acrylic compound (I) according to the invention provide on photomolding or stereolithographic hardening a hardened product having extremely excellent heat resistance as proved by its heat distortion temperature considerably exceeding 100° C. Because of reduced volume shrinkage on photohardening, the hardened products show excellent dimensional accuracy. Further, the hardened products exhibit excellent mechanical characteristics as verified by their high tensile strength and modulus.

It is also seen that the photohardenable resin composition of Example 5, which contains solid particles and whiskers, provides a hardened product exhibiting extremely high heat resistance as testified by its far higher heat distortion temperature and excellent dimensional accuracy owing to the markedly reduced volume shrinkage on photohardening. The hardened product is also excellent in mechanical characteristics, such as tensile strength and tensile modulus.

On the other hand, the hardened product obtained from the photohardenable resin composition of Comparative Example 1, which comprises a urethanated acrylic compound out of the scope of formula (I), i.e., the compound in which b, c, and d in the group A are all zero, and L is —(CH$_2$CH (CH$_3$)O)$_6$—, and a radical polymerizable compound, is inferior in heat resistance, as is seen from its heat distortion temperature as low as 58° C. The hardened product is also inferior in mechanical characteristics as is seen from the extremely small tensile strength and the low tensile modulus.

Further, the photohardenable resin composition of Comparative Example 2, which comprises a urethanated acrylic compound out of the scope of formula (I), i.e., the compound in which b, c, and d in the group A are all zero and which has no group L, and a radical polymerizable compound, is too viscous to be used for stereolithography. Moreover, the one skilled in the art that various changes and modifications can be made therein without departing from the spirit and scope thereof.

What is claimed is:

1. A photohardenable resin composition comprising:
(i) at least one urethanated acrylic compound represented by formula (I):

wherein R represents a hydrogen atom or an alkyl group; a represents 3 or 4; and A represents a group represented by formula (II):

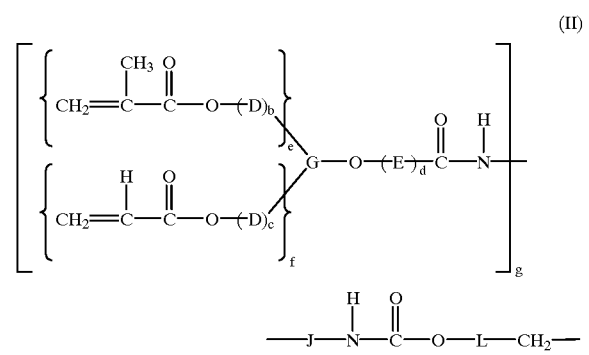

wherein D represents —CH$_2$CH$_2$O—, —CH$_2$CH(CH$_3$)O—, —CH$_2$CH$_2$COO— or —(CH$_2$)$_6$COO—; E represents —CH$_2$CH$_2$O—, —CH$_2$CH(CH$_3$)O—, —COCH$_2$CH$_2$O— or —CO(CH$_2$)$_6$O—; G represents a triol residual group; J represents a divalent or trivalent and substituted or unsubstituted hydrocarbon group; L represents —(CH$_2$CH$_2$O)$_h$—, wherein h represents an integer of 1 to 4, —(CH$_2$CH(CH$_3$)O)$_j$—, wherein j represents an integer of 1 to 4, or —(CH$_2$CH$_2$O)$_k$—(CH$_2$CH(CH$_3$)O)$_m$—, wherein k and m each represent an integer of 1 to 3 provided that the sum of k and m is 2, 3 or 4; b and c each represent 0 or 1, provided that the sum of b, c, and d is 1, 2 or 3; d=e=f=1; and g represents 1 or 2;

(ii) a radical polymerizable compound other than said urethanated acrylic compound of formula (I); and (iii) a photosensitive polymerization initiator, wherein the weight ratio of said urethanated acrylic compound (i) to said radical polymerizable compound (ii) is in the range of from 80:20 to 10:90.

2. A photohardenable resin composition according to claim 1, wherein said photosensitive polymerization initiator (iii) is present in an amount of 0.1 to 10% by weight based on the total weight of said urethanated acrylic compound (i) and said radical polymerizable compound (ii).

3. A photohardenable resin composition according to claim 1, which further comprises (iv) at least one filler selected from solid particles and whiskers.

4. A photohardenable resin composition according to claim 3, which comprises both solid particles and whiskers as component (iv).

5. A photohardenable resin composition according to claim 3, wherein said solid particles are spherical.

6. A photohardenable resin composition according to claim 3, wherein said whiskers have a diameter of 0.3 to 1 μm, a length of 10 to 70 μm, and an aspect ratio of 10 to 100.

7. A photohardenable resin composition according to claim 3, wherein said filler (iv) has been treated with a silane coupling agent.

8. A photohardenable resin composition according to claim 3, wherein said filler (iv) is present in an amount of 3 to 70% by volume based on the volume of the photohardenable resin composition before addition of the filler.

9. A photohardenable resin composition according to claim 1, which is for stereolithography.

10. The photohardenable resin composition according to claim 1, wherein b=c=1.

11. A urethanated acrylic compound represented by formula (I):

wherein R represents a hydrogen atom or an alkyl group; a represents 3 or 4; and A represents a group represented by formula (II):

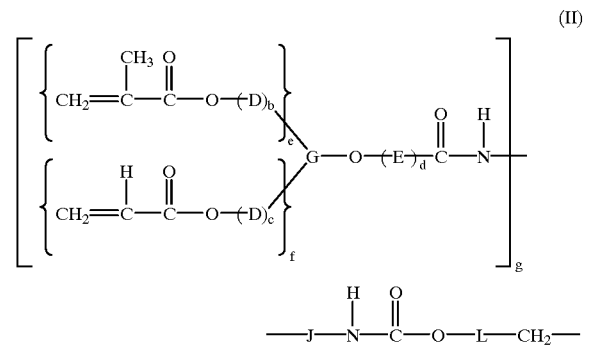

wherein D represents —CH$_2$CH$_2$O—, —CH$_2$CH(CH$_3$)O—, —CH$_2$CH$_2$COO— or —(CH$_2$)$_6$COO—; E represents —CH$_2$CH$_2$O—, —CH$_2$CH(CH$_3$)O —, —COCH$_2$CHO— or —CO(CH$_2$)$_6$O—; G represents a triol residual group; J represents a divalent or trivalent and substituted or unsubstituted hydrocarbon group; L represents —(CH$_2$CH$_2$O)$_h$—, wherein h represents an integer of 1 to 4, —(CH$_2$CH(CH$_3$)O)$_j$—, wherein j represents an integer of 1 to 4, or —(CH$_2$CH$_2$O)$_k$—(CH$_2$CH(CH$_3$)O)$_m$—, wherein k and m each represent an integer of 1 to 3 provided that the sum of k and m is 2, 3 or 4; b and c each represent 0 or 1, provided that the sum of b, c, and d is 1, 2 or 3; d=e=f=1; and g represents 1 or 2.

12. The urethanated acrylic compound according to claim 11 wherein b=c=1.

* * * * *